US008809689B2

(12) United States Patent
Olden et al.

(10) Patent No.: US 8,809,689 B2
(45) Date of Patent: Aug. 19, 2014

(54) SYSTEMS AND METHODS FOR COMPOSITE STRUCTURES WITH EMBEDDED INTERCONNECTS

(75) Inventors: Thomas A. Olden, Tucson, AZ (US); Walter Wrigglesworth, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/539,677

(22) Filed: Jul. 2, 2012

(65) Prior Publication Data

US 2012/0273260 A1 Nov. 1, 2012

Related U.S. Application Data

(62) Division of application No. 12/606,462, filed on Oct. 27, 2009, now abandoned.

(60) Provisional application No. 61/230,559, filed on Jul. 31, 2009.

(51) Int. Cl.
| | |
|---|---|
| *H05K 1/00* | (2006.01) |
| *H05K 1/03* | (2006.01) |
| *H05K 3/46* | (2006.01) |
| *H05K 3/00* | (2006.01) |
| *H05K 1/02* | (2006.01) |
| *H05K 1/05* | (2006.01) |

(52) U.S. Cl.
CPC ............ *H05K 1/0366* (2013.01); *H05K 3/4632* (2013.01); *H05K 3/0014* (2013.01); *H05K 2201/0323* (2013.01); *H05K 2201/092* (2013.01); *H05K 1/0284* (2013.01); *H05K 2201/09063* (2013.01); *H05K 2203/302* (2013.01); *H05K 3/465* (2013.01); *H05K 2201/09018* (2013.01); *H05K 1/05* (2013.01)
USPC .......................................... 174/254; 164/262

(58) Field of Classification Search
CPC ... H05K 1/0366; H05K 3/465; H05K 1/0284; H05K 1/05; H05K 3/0014; H05K 3/4632; H05K 2203/302; H05K 2201/0323; H05K 2201/09018; H05K 2201/09063; H05K 2201/092; H05K 1/036; H05K 2201/0195
USPC ......... 361/749, 760, 748, 792, 777, 751, 752; 439/77

See application file for complete search history.

(56) References Cited

U.S. PATENT DOCUMENTS

| | | | |
|---|---|---|---|
| 2,986,001 | A | 5/1961 | Green |
| 3,023,570 | A | 3/1962 | Crouch et al. |

(Continued)

FOREIGN PATENT DOCUMENTS

| | | |
|---|---|---|
| DE | 10239347 A1 | 3/2004 |
| EP | 1111971 A1 | 6/2001 |

(Continued)

OTHER PUBLICATIONS

PCT International Preliminary Report on Patentability, IPRP, International Application No. PCT/US2011/053100; Search Report and Written Opinion; International Filing Date: Sep. 23, 2011; Date of Mailing: May 23, 2013; pp. 1-7.

(Continued)

*Primary Examiner* — Ishwarbhai B Patel
(74) *Attorney, Agent, or Firm* — Cantor Colburn LLP

(57) ABSTRACT

A composite interconnect assembly includes a body structure formed from a composite material (e.g., a carbon graphite material) with one or more conductive traces embedded therein (e.g., a copper or copper alloy). One or more contact regions are provided such that the conductive traces are exposed and are configured to mechanically and electrically connect to one or more electronic components. The body structure may have a variety of shapes, including planar, cylindrical, conical, and the like.

16 Claims, 1 Drawing Sheet

(56) References Cited

U.S. PATENT DOCUMENTS

| | | | |
|---|---|---|---|
| 3,093,964 A | 6/1963 | Hausmatm | |
| 3,133,773 A | 5/1964 | Ecker | |
| 3,226,928 A | 1/1966 | Webb et al. | |
| 3,248,875 A | 5/1966 | Wolcott | |
| 3,250,070 A | 5/1966 | Milewski | |
| 3,316,718 A | 5/1967 | Webb et al. | |
| 3,367,268 A | 2/1968 | Spenadel | |
| 3,385,063 A | 5/1968 | Brown | |
| 3,393,517 A | 7/1968 | Altman | |
| 3,397,539 A | 8/1968 | Schubert | |
| 3,442,084 A | 5/1969 | Dilchert | |
| 3,527,168 A | 9/1970 | McCurdy et al. | |
| 3,555,825 A | 1/1971 | Dilchert | |
| 3,581,662 A | 6/1971 | Grebert | |
| 3,584,461 A | 6/1971 | Debize | |
| 3,595,025 A | 7/1971 | Stockel et al. | |
| 3,698,183 A | 10/1972 | MacDonald et al. | |
| 3,992,877 A | 11/1976 | Granger | |
| 4,007,688 A | 2/1977 | Franz | |
| 4,249,673 A | 2/1981 | Katoh et al. | |
| 4,345,427 A | 8/1982 | Whitesides, Jr. | |
| 4,357,795 A | 11/1982 | Bastian et al. | |
| 4,364,531 A | 12/1982 | Knoski | |
| 4,505,180 A | 3/1985 | Hinrichs | |
| 4,539,910 A | 9/1985 | Stevens | |
| 4,738,100 A | 4/1988 | Koorey | |
| 4,972,673 A | 11/1990 | Carrier | |
| 4,979,697 A | 12/1990 | Kranz | |
| 5,024,160 A | 6/1991 | Canterberry et al. | |
| 5,062,593 A | 11/1991 | Goddard et al. | |
| 5,160,070 A | 11/1992 | Hibler et al. | |
| 5,211,358 A | 5/1993 | Bagley | |
| 5,220,488 A | 6/1993 | Denes | |
| 5,238,204 A | 8/1993 | Metz | |
| 5,433,399 A | 7/1995 | Becker et al. | |
| 5,440,993 A | 8/1995 | Osofsky | |
| 5,456,425 A | 10/1995 | Morris et al. | |
| 5,608,183 A | 3/1997 | Barnes et al. | |
| 5,613,358 A | 3/1997 | Humiston et al. | |
| 5,647,558 A | 7/1997 | Linick | |
| 5,675,966 A | 10/1997 | Dombrowski et al. | |
| 5,765,367 A | 6/1998 | Denoel et al. | |
| 5,853,143 A | 12/1998 | Bradley et al. | |
| 5,959,235 A | 9/1999 | Wagstaff | |
| 6,045,638 A | 4/2000 | Lundstrom | |
| 6,202,037 B1 | 3/2001 | Hattori et al. | |
| 6,244,535 B1 | 6/2001 | Felix | |
| 6,352,030 B1 | 3/2002 | Doll et al. | |
| 6,357,357 B1 | 3/2002 | Glasser | |
| 6,502,785 B1 | 1/2003 | Teter et al. | |
| 6,554,936 B1 | 4/2003 | Metcalf et al. | |
| 6,580,228 B1 | 6/2003 | Chen et al. | |
| 6,629,362 B2 * | 10/2003 | Kobayashi et al. | 29/830 |
| 6,647,888 B1 | 11/2003 | Cesaroni et al. | |
| 6,692,655 B1 | 2/2004 | Martins et al. | |
| 6,713,688 B2 | 3/2004 | Kokufu et al. | |
| 6,739,121 B2 | 5/2004 | Kline et al. | |
| 6,745,696 B1 | 6/2004 | Rotkopf | |
| 6,869,665 B2 | 3/2005 | Tani et al. | |
| 6,895,991 B2 | 5/2005 | Woessner | |
| 6,968,676 B1 | 11/2005 | Krishnan | |
| 7,000,377 B1 | 2/2006 | Knight | |
| 7,003,942 B2 | 2/2006 | Le Helley et al. | |
| 7,022,196 B2 | 4/2006 | Cesaroni et al. | |
| 7,194,852 B1 | 3/2007 | Krishnan | |
| 7,258,936 B2 | 8/2007 | Zheng et al. | |
| 7,281,367 B2 | 10/2007 | Rohrbaugh et al. | |
| 7,312,401 B2 | 12/2007 | Tsukada et al. | |
| 7,442,879 B2 * | 10/2008 | Das et al. | 174/262 |
| 7,685,940 B1 | 3/2010 | Cavalleri et al. | |
| 7,737,367 B2 | 6/2010 | Koyama et al. | |
| 7,886,519 B2 | 2/2011 | Woessner et al. | |
| 7,947,938 B2 | 5/2011 | Dryer | |
| 8,015,920 B1 | 9/2011 | Wilkinson et al. | |
| 8,144,478 B1 | 3/2012 | Hayward | |
| 2001/0003294 A1 | 6/2001 | Mahaffy | |
| 2002/0053377 A1 | 5/2002 | Martin et al. | |
| 2002/0129808 A1 | 9/2002 | Manner | |
| 2002/0157557 A1 | 10/2002 | Cesaroni et al. | |
| 2002/0195181 A1 | 12/2002 | Lundstrom et al. | |
| 2003/0200656 A1 | 10/2003 | Wilson | |
| 2004/0109039 A1 | 6/2004 | Kojima et al. | |
| 2004/0244890 A1 | 12/2004 | Cesaroni | |
| 2005/0048808 A1 | 3/2005 | Black et al. | |
| 2005/0188677 A1 | 9/2005 | Nyberg et al. | |
| 2007/0044450 A1 | 3/2007 | Kuninaka | |
| 2008/0216462 A1 | 9/2008 | Woessner et al. | |
| 2008/0295327 A1 | 12/2008 | Aeling et al. | |
| 2009/0046441 A1 | 2/2009 | Funaya et al. | |
| 2009/0235640 A1 | 9/2009 | Cavalleri et al. | |
| 2010/0011742 A1 | 1/2010 | Cavalleri et al. | |
| 2010/0032516 A1 | 2/2010 | Olden et al. | |
| 2010/0044096 A1 | 2/2010 | Kuczynski et al. | |
| 2010/0122843 A1 | 5/2010 | Yokouchi et al. | |
| 2010/0327106 A1 | 12/2010 | Brinkerhoff et al. | |
| 2011/0024165 A1 | 2/2011 | Olden | |
| 2012/0036831 A1 | 2/2012 | Olden et al. | |

FOREIGN PATENT DOCUMENTS

| | | |
|---|---|---|
| EP | 1843124 A1 | 10/2007 |
| GB | 1605168 A | 9/1982 |
| GB | 2124035 A | 2/1984 |
| WO | 0217690 A1 | 2/2002 |
| WO | 2008048702 A2 | 4/2008 |
| WO | 2008056500 A1 | 5/2008 |
| WO | 2009151796 A2 | 12/2009 |

OTHER PUBLICATIONS

U.S. Appl. No. 12/606,462; Final Office Action; Date Filed: Oct. 27, 2009; Date Mailed: Apr. 9, 2012; pp. 1-20.

PCT—International Preliminary Report on Patentability; International Application No. PCT/US2010/028164; International Filing Date: Mar. 22, 2010; Date of Mailing: Feb. 9, 2012; pp. 1-2.

International Searching Authority, European Patent Office, "International Search Report," Mailed Jul. 26, 2010; International Application No. PCT/US2010/028164; filed Mar. 22, 2010.

International Searching Authority, European Patent Office, "International Search Report—Written Opinion," Mailed Jul. 26, 2010; International Application No. PCT/US2010/028164; filed Mar. 22, 2010.

David H. Lewis, et al., "Digital MicroPropulsion," Micro Electro Mechanical Systems, Twelfth IEEE International Conference; pp. 517-522; Jan. 1999.

International Search Report; International Application No. PCT/US2010/053100; International Filing Date: Sep. 23, 2011; Date of Mailing: Feb. 2, 2012; pp. 1-6.

PCT—International Search Report and Written Opinion; International Application No. PCT/US2010/028164; International Filing Date: Mar. 22, 2010; Date of Mailing: Jan. 31, 2012, pp. 1-7.

International Search Report—Written Opinion; International Application No. PCT/US2011/053100; International Filing Date: Sep. 23, 2011; Date of Mailing: Feb. 2, 2012; pp. 1-7.

European Patent Office, International Searching Authority, "International Search Report," mailed Jul. 26, 2010; International Application No. PCT/US2010/028164 filed Mar. 22, 2010.

European Patent Office, International Searching Authority, "International Search Report and Written Opinion," mailed Dec. 8, 2009; International Application No. PCT/US2009/033248 filed Feb. 5, 2009.

European Patent Office, International Searching Authority, "International Search Report and Written Opinion," mailed Dec. 7, 2009; International Application No. PCT/US2009/033694 filed Feb. 10, 2009.

PCT—Written Opinion—IPRP; International Application No. PCT/US2010/028164; International Filing Date: Mar. 22, 2010; Date of Mailing: Feb. 9, 2012; pp. 1-5.

Olden, Thomas A. et al. "Systems and Methods for Composite Structures with Embedded Interconnects," U.S. Appl. No. 12/606,462, filed Oct. 27, 2009.

(56) References Cited

OTHER PUBLICATIONS

Olden, Thomas A. et al. "Pellett-Loaded Multiple-Impulse Rocket Motor," U.S. Appl. No. 12/391,216, filed Feb. 23, 2009.

Final Office Action issued in U.S. Appl. No. 12/945,440, mailed Feb. 13, 2014, 10 pages.
Non-Final Office Action issued in U.S. Appl. No. 12/945,440, mailed Dec. 6, 2013, 42 pages.

* cited by examiner

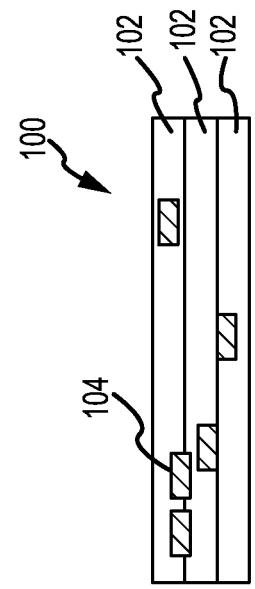
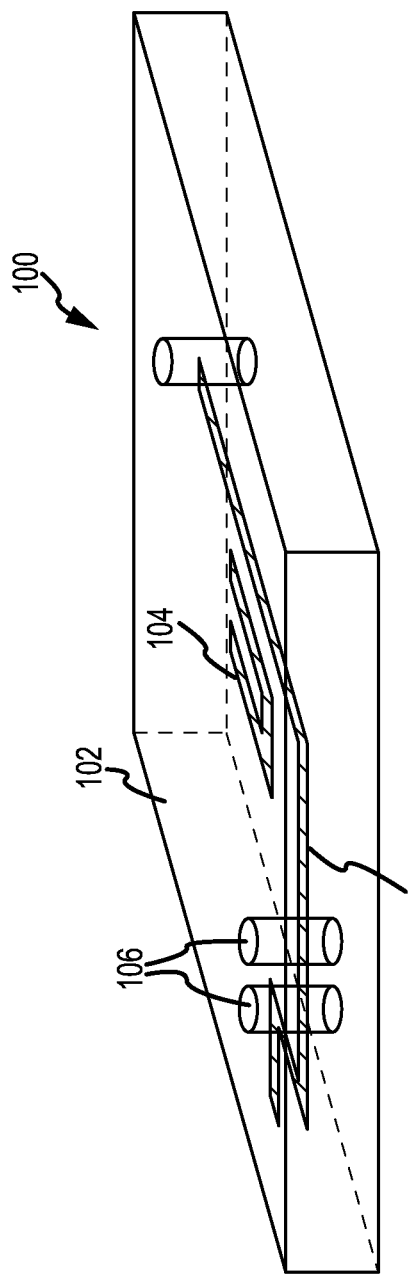
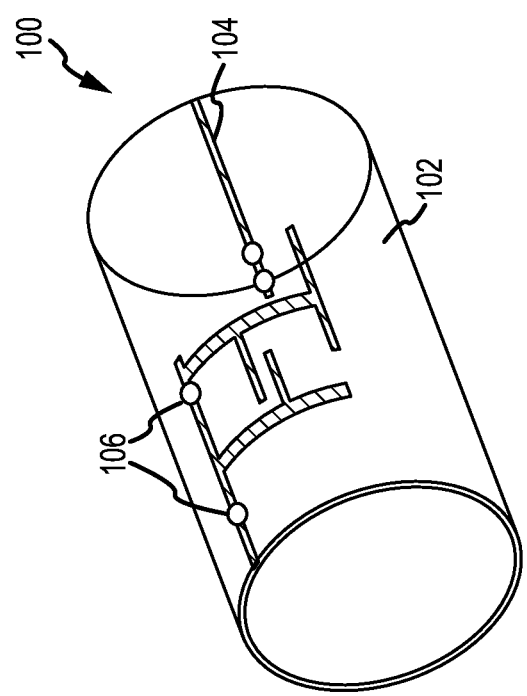

SYSTEMS AND METHODS FOR COMPOSITE STRUCTURES WITH EMBEDDED INTERCONNECTS

CROSS-REFERENCE TO RELATED APPLICATIONS

This application is a divisional of U.S. patent application Ser. No. 12/606,462, filed Oct. 27, 2009, which claims priority to U.S. Provisional Patent Application Ser. No. 61/230,559, filed Jul. 31, 2009, the disclosure of which is incorporated by reference herein in its entirety.

TECHNICAL FIELD

The present invention generally relates to printed circuit boards and other interconnect structures used for mounting and connecting electrical components.

BACKGROUND

Printed circuit boards (PCBs) are widely used many industries, and typically consist of laminate structures with one or more levels of metallization or other conductors to interconnect the components attached to the board. Commonly known boards, however, are unsatisfactory in a number of respects.

For example, because standard PCBs do not exhibit significant structural strength and are prone to bending, torsion, and buckling, it is typically necessary to provide an additional rigid structure for mounting to the PCB. This adds weight, manufacturing cost, and complexity.

Furthermore, standard PCBs, even in automated processes, often require significant human handling. Such processes are time-consuming, expensive, and can significantly increase the amount of foreign object debris (FOD) that enters the system.

Finally, standard PCBs are generally planar, and thus for any given mounting area they typically limit the range of enclosure shapes and sizes that a designer may employ.

Accordingly, it is desirable to provide improved interconnect structures that have structural strength, can be formed in a variety of shapes, and reduce human interaction during component mounting. Other desirable features and characteristics of the present invention will become apparent from the subsequent detailed description and the appended claims, taken in conjunction with the accompanying drawings and the foregoing technical field and background.

SUMMARY

In accordance with one embodiment, a composite interconnect assembly includes a body structure comprising a composite material (e.g., a carbon graphite material) with one or more conductive traces embedded therein (e.g., a copper or copper alloy). One or more contact regions are provided such that the conductive traces are exposed and are configured to mechanically and electrically connect to one or more electronic components. The body structure may have a variety of shapes, including planar, cylindrical, conical, and the like.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

FIG. 1 is a conceptual isometric view of a composite assembly in accordance with one embodiment of the invention;

FIG. 2 is a conceptual isometric view of an alternate embodiment of the present invention; and FIG. 3 is a cross-section of one embodiment of the present invention.

DETAILED DESCRIPTION

The following discussion generally relates to improved methods and apparatus for removing connectors from circuit card assemblies. In that regard, the following detailed description is merely illustrative in nature and is not intended to limit the invention or the application and uses of the invention. Furthermore, there is no intention to be bound by any expressed or implied theory presented in the preceding technical field, background, brief summary or the following detailed description. In the interest of brevity, conventionally known techniques and principles relating to composites, interconnects, and the like need not be described herein.

Referring now to FIG. 1, in accordance with one embodiment of the present invention, a composite assembly 100 generally includes electrical traces, interconnects, wires, or any other conductive connector 104 (collectively referred to as "traces") incorporated, molded into, embedded, or otherwise formed within a composite material structure (or "body structure") 102.

Holes, vias, contacts, or other contact structures 106 to which components can be mechanically and electrically connected are also provided within body 102, and allow for contact to respective sections of traces 104. A variety of electronic components may be mounting to structure 102, including microcontrollers, power semiconductors, or any other electronic component now known or later developed.

The term "composite" as used herein with respect to body 102 generally refers to materials that are engineered from two or more constituent materials with significantly different physical or chemical properties that remain separate and distinct on a macroscopic level. Such composite materials include, for example, conventional carbon graphite materials as well as any other suitable composite material now known or later developed, such as fiber-reinforced polymers (FRPs), metal matrix composites (MMC), cermets, and the like.

The material used for the electrical traces might include any suitable conductive material, including metals, semiconductors (e.g., polysilicon), or the like. In a preferred embodiment, the traces comprise a copper or copper alloy.

The composite assembly may be produced in a variety of ways. For example, body 102 may be formed around traces 104 (e.g., via molding). In another embodiment, traces 104 are inserted into or sandwiched between multiple layers of composite structures. In this regard, while the illustrated embodiments of FIGS. 1 and 2 depict a single layer of conductive traces, the invention is not so limited, and may include any number of trace layers. FIG. 3, for example, shows a multiple trace layers as well as multiple layers of composite structure 102 that are suitably bonding together.

Traces 104 may be formed, for example, by common metal deposition methods or masking operations, depending upon the nature of the conductor used. In an example embodiment, the traces 104 and related contacts are designed a software tool, such as the Gerber Plotting System. Subsequently, conventional transfer methods are used to apply the traces, etching away any excess material.

Openings 106 may be configured to receive individual leads, flanges, or conductive bumps associated with the components to be attached, or may be configured to allow components to be fully or partially recessed within a cavity within structure 104. In this way, the opening may expose sections of traces 104 that correspond to the configuration of respective leads on the mounted components.

The composite assembly may have a variety of shapes, including planar, circular, cylindrical, spherical, hemispherical, or any curvilinear manifold structure. In one embodiment, for example, the composite assembly is planar and has openings to receive electrical components. Leads from the electrical components project from one side of the assembly, and may then be soldered to the electrical traces via the desired bonding method, (e.g., solder paste or metal alloy solders). The projecting leads may then be clipped in the conventional manner.

In an alternate embodiment, shown in FIG. 2, the assembly is substantially in the shape of a tube (e.g., a hollow cylinder), in which the electrical components are inserted radially from the outer perimeter toward the interior (e.g., in holes or openings provided for that purpose). The components are then electrically connected and finished in any suitable manner.

The various composite structures of the present invention provide a number of advantages over traditional PCB boards. For example, composite materials are relatively strong and have a high yield strength. As a result, it is not necessary to build a supporting rigid structure to accompany it.

The thickness of the composite structure may be relatively low, given the structural integrity of the material used. That is, interconnect structures can be made significantly thinner using this technology than is the case with standard PCBs, e.g., less than about 1.5 mm.

Furthermore, as the structure can be formed in a number of shapes, it can be inserted into tight spaces—e.g., typical conical or cylindrical enclosures common in missiles, rockets, and other aeronautical structures. In one embodiment, a DAC (divert attitude control) assembly of the type used in connection with ballistic missiles, kill vehicles, and the like includes a composite assembly as described.

In addition, the electrical circuit can be validated before a mission has started, eliminating hand soldering and FOD issues. Alignment, tolerances, and repeatability of the assembly are also enhanced.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient and edifying road map for implementing the described embodiment or embodiments. It should be understood that various changes can be made in the function and arrangement of elements without departing from the scope of the invention and the legal equivalents thereof.

The invention claimed is:

1. A composite interconnect assembly, comprising:
a generally tubular, composite body structure comprising layers of two or more constituent materials having different physical and chemical properties;
a conductive trace embedded within the composite body structure at a border between the layers, the conductive trace traversing the border such that a portion of the conductive trace only partially intrudes into and forms at least three contact surfaces with one of the layers and an opposite portion of the conductive trace only partially intrudes into and forms at least three contact surfaces with the other of the layers; and
a contact region defined on the composite body structure such that the conductive trace is exposed and is configured to mechanically and electrically connect to an external electronic component,
wherein one of the two or more materials of the composite body structure is a carbon graphite material.

2. The composite interconnect assembly of claim 1, wherein the composite body structure has a thickness of less than approximately 1.5 mm.

3. The composite interconnect assembly of claim 1, wherein the conductive trace comprises copper.

4. The composite interconnect assembly of claim 1, wherein the contact region is an opening in the composite body structure extending to the conductive trace.

5. The composite interconnect assembly of claim 1, wherein the contact region is a bond pad substantially flush with the composite body structure.

6. The composite interconnect assembly of claim 1, wherein the contact region is a through-hole structure.

7. The composite interconnect assembly of claim 1, further comprising electrical components disposed radially from the outer perimeter of the tubular, composite body structure toward an interior of the tubular, composite body structure.

8. The composite interconnect assembly of claim 1, further comprising a plurality of conductive traces configured within multiple levels.

9. A composite interconnect assembly, comprising:
a composite body structure comprising at least two layers, with each layer comprising two or more constituent materials having different physical and chemical properties;
a conductive trace embedded within the composite body structure at a border between the layers, the conductive trace traversing the border such that a portion of the conductive trace only partially intrudes into and forms at least three contact surfaces with one of the layers and an opposite portion of the conductive trace only partially intrudes into and forms at least three contact surfaces with the other of the layers; and
a contact region defined on the composite body structure such that the conductive trace is exposed and is configured to mechanically and electrically connect to an external electronic component,
wherein one of the two or more materials of the composite body structure is a carbon graphite material.

10. The composite interconnect assembly of claim 9, wherein the composite body structure has a thickness of less than approximately 1.5 mm.

11. The composite interconnect assembly of claim 9, wherein the conductive trace comprises copper.

12. The composite interconnect assembly of claim 9, wherein the contact region is an opening in the composite body structure extending to the conductive trace.

13. The composite interconnect assembly of claim 9, wherein the contact region is a bond pad substantially flush with the composite body structure.

14. The composite interconnect assembly of claim 9, wherein the contact region is a through-hole structure.

15. The composite interconnect assembly of claim 9, further comprising a plurality of conductive traces configured within multiple levels.

16. A composite interconnect assembly, comprising:
a composite body structure comprising at least two layers, with each layer comprising two or more constituent materials having different physical and chemical properties;

a plurality of conductive traces embedded within the composite body structure and comprising:
- a first conductive trace, which is wholly encompassed within one of the layers,
- a second conductive trace at a border between the layers such that the second conductive trace only partially intrudes into and forms at least three contact surfaces with one of the layers and forms one contact surface with the other of the layers, and
- a third conductive trace traversing the border such that a portion of the conductive trace only partially intrudes into and forms at least three contact surfaces with one of the layers and an opposite portion of the conductive trace only partially intrudes into and forms at least three contact surfaces with the other of the layers; and
- a plurality of contact regions defined on the composite body structure such that each of the plurality of conductive traces is exposed and is configured to mechanically and electrically connect to an external electronic component,
- wherein one of the two or more materials of the composite body structure is a carbon graphite material.

\* \* \* \* \*